United States Patent
Ngo et al.

(10) Patent No.: US 6,388,330 B1
(45) Date of Patent: May 14, 2002

(54) LOW DIELECTRIC CONSTANT ETCH STOP LAYERS IN INTEGRATED CIRCUIT INTERCONNECTS

(75) Inventors: Minh Van Ngo, Fremont; Dawn M. Hopper, San Jose; Robert A. Huertas, Hollister; Terri J. Kitson, San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/776,012

(22) Filed: Feb. 1, 2001

(51) Int. Cl.[7] .......................... H01L 23/48; H01L 23/52
(52) U.S. Cl. ..................... 257/760; 257/758; 257/759; 257/762; 257/765
(58) Field of Search ................... 438/622–624, 438/629, 631, 633, 634, 637–640, 672, 675, 687, 688, 692, 783, 791; 257/758–760, 762, 765

(56) References Cited

U.S. PATENT DOCUMENTS 6,071,809 A * 6/2000 Zhao ........................... 438/634
6,168,726 B1 * 1/2001 Li et al. ....................... 216/79
6,245,662 B1 * 6/2001 Naik et al. .................. 438/622

FOREIGN PATENT DOCUMENTS

WO         WO 99/33102         * 7/1999

* cited by examiner

Primary Examiner—Ha Tran Nguyen
(74) Attorney, Agent, or Firm—Mikio Ishimaru

(57) ABSTRACT

An integrated circuit and method of manufacture therefore is provided having a semiconductor substrate with a semiconductor device with a dielectric layer over the semiconductor substrate. A conductor core fills the opening in the dielectric layer. An etch stop layer with a dielectric constant below 5.5 is formed over the first dielectric layer and conductor core. A second dielectric layer over the etch stop layer has an opening provided to the conductor core. A second conductor core fills the second opening and is connected to the first conductor core.

10 Claims, 2 Drawing Sheets

LOW DIELECTRIC CONSTANT ETCH STOP LAYERS IN INTEGRATED CIRCUIT INTERCONNECTS

TECHNICAL FIELD

The present invention relates generally to semiconductor technology and more specifically to etch stop layers in integrated circuits.

BACKGROUND ART

In the manufacture of integrated circuits, after the individual devices such as the transistors have been fabricated in and on the semiconductor substrate, they must be connected together to perform the desired circuit functions. This interconnection process is generally called "metalization" and is performed using a number of different photolithographic, deposition, and removal techniques.

Briefly, individual semiconductor devices are formed in and on a semiconductor substrate and a device dielectric layer is deposited. Various techniques are used to form gate and source/drain contacts, which extend up to the surface of the device dielectric layer. In a process called the "damascene" technique, dielectric layers are deposited over the device dielectric layers and openings are formed in the dielectric layers. Conductor materials are deposited on the dielectric layers and in the openings. A process is used to planarize the conductor materials with the surface of the dielectric layers so as to cause the conductor materials to be "inlaid" in the dielectric layers.

More specifically, for a single layer of interconnections a "single damascene" technique is used in which the first channel formation of the single damascene process starts with the deposition of a thin first channel stop layer over the device dielectric layer. The first channel stop layer is an etch stop layer which is subject to a photolithographic processing step which involves deposition, patterning, exposure, and development of a photoresist, and an anisotropic etching step through the patterned photoresist to provide openings to the device contacts. The photoresist is then stripped. A first channel dielectric layer is formed on the first channel stop layer. Where the first channel dielectric layer is of an oxide material, such as silicon oxide ($SiO_2$), the first channel stop layer is a nitride, such as silicon nitride (SiN), so the two layers can be selectively etched.

The first channel dielectric layer is then subject to further photolithographic process and etching steps to form first channel openings in the pattern of the first channels. The photoresist is then stripped.

An optional thin adhesion layer is deposited on the first channel dielectric layer and lines the first channel openings to ensure good adhesion of subsequently deposited material to the first channel dielectric layer. Adhesion layers for copper (Cu) conductor materials are composed of compounds such as tantalum nitride (TaN), titanium nitride (TiN), or tungsten nitride (WN).

These nitride compounds have good adhesion to the dielectric materials and provide fair barrier resistance to the diffusion of copper from the copper conductor materials to the dielectric material. High barrier resistance is necessary with conductor materials such as copper to prevent diffusion of subsequently deposited copper into the dielectric layer, which can cause short circuits in the integrated circuit. However, these nitride compounds also have relatively poor adhesion to copper and relatively high electrical resistance.

Because of the drawbacks, pure refractory metals such as tantalum (Ta), titanium (Ti), or tungsten (W) are deposited on the adhesion layer to line the adhesion layer in the first channel openings. The refractory metals are good barrier materials, have lower electrical resistance than their nitrides, and have good adhesion to copper.

In some cases, the barrier material has sufficient adhesion to the dielectric material that the adhesion layer is not required, and in other cases, the adhesion and barrier material become integral. The adhesion and barrier layers are often collectively referred to as a "barrier" layer herein.

For conductor materials such as copper, which are deposited by electroplating, a seed layer is deposited on the barrier layer and lines the barrier layer in the first channel openings to act as an electrode for the electroplating process. Processes such as electroless, physical vapor, and chemical vapor deposition are used to deposit the seed layer.

A first conductor material is deposited on the seed layer and fills the first channel opening. The first conductor material and the seed layer generally become integral, and are often collectively referred to as the conductor core when discussing the main current-carrying portion of the channels.

A chemical-mechanical polishing (CMP) process is then used to remove the first conductor material, the seed layer, and the barrier layer above the first channel dielectric layer to form the first channels. When a layer is placed over the first channels as a final layer, it is called a "capping" layer and a "single" damascene process is completed. When the layer is processed further for placement of additional channels over it, the layer is a via stop layer.

For more complex integrated circuits, a "dual damascene" technique is used in which channels of conductor materials are separated by interlayer dielectric layers in vertically separated planes and interconnected by vertical connections, or "vias".

More specifically, the dual damascene process starts with the deposition of a thin etch stop layer, or the via stop layer, over the first channels and the first channel dielectric layer. A via dielectric layer is deposited on the via stop layer. Again, where the via dielectric layer is of an oxide material, such as silicon oxide, the via stop layer is a nitride, such as silicon nitride, so the two layers can be selectively etched.

Second channel stop and second channel dielectric layers are formed on the via dielectric layer. Again, where the second channel dielectric layer is of an oxide material, such as silicon oxide, the second channel stop layer is a nitride, such as silicon nitride, so the two layers can be selectively etched. The second channel and via stop layers and second channel and via dielectric layers are then subject to further photolithographic process, etching, and photoresist removal steps to form via and second channel openings in the pattern of the second channels and the vias.

An optional thin adhesion layer is deposited on the second channel dielectric layer and lines the second channel and the via openings.

A barrier layer is then deposited on the adhesion layer and lines the adhesion layer in the second channel openings and the vias.

Again, for conductor materials such as copper and copper alloys, a seed layer is deposited by electroless deposition on the barrier layer and lines the barrier layer in the second channel openings and the vias.

A second conductor material is deposited on the seed layer and fills the second channel openings and the vias.

A CMP process is then used to remove the second conductor material, the seed layer, and the barrier layer above the second channel dielectric layer to form the second channels. When a layer is placed over the second channels as a final layer, it is called a "capping" layer and the dual damascene process is completed.

The capping layer may be an etch stop layer and may be processed farther for placement of additional levels of channels and vias over it. Individual and multiple levels of single and dual damascene structures can be formed for single and multiple levels of channels and vias, which are collectively referred to as "interconnects".

The use of the single and dual damascene techniques eliminates metal etch and dielectric gap fill steps typically used in the metalization process. The elimination of metal etch steps is important as the semiconductor industry moves from aluminum (Al) to other metalization materials, such as copper, which are very difficult to etch.

Further for placement of additional levels of channels and vias over it. Individual and multiple levels of single and dual damascene structures can be formed for single and multiple levels of channels and vias, which are collectively referred to as "interconnects".

The use of the single and dual damascene techniques eliminates metal etch and dielectric gap fill steps typically used in the metallization process. The elimination of metal etch steps is important as the semiconductor industry moves from aluminum (Al) to other metallization materials, such as copper, which are very difficult to etch.

With the development of high integration and high-density very large scale integrated circuits, reductions in the size of transistors and interconnects have been accompanied by increases in switching speed of such integrated circuits. The closeness of the interconnects and the higher switching speeds have increased the problems due to switching slowdowns resulting from capacitance coupling effects between the closely positioned, parallel conductive channels connecting high switching speed semiconductor devices in these integrated circuits. Since the capacitance coupling effects are reduced when the dielectric constant of the material between the channels is reduced, this has rendered currently used silicon nitride, which has a dielectric constant in excess of 7.5, problematic for protective dielectric layers, such as etch stop layers.

A solution for reducing the dielectric constant of the materials used in interconnects has been long sought but has eluded those skilled in the art. In this area, even small reductions in the dielectric constant are significant.

DISCLOSURE OF THE INVENTION

The present invention provides an integrated circuit having a semiconductor substrate with a semiconductor device. A dielectric layer is on the semiconductor substrate and has an opening provided therein. A conductor core fills the opening and an etch stop layer over the first dielectric layer and conductor core has a dielectric constant below 5.5. A second dielectric layer over the etch stop layer has an opening provided to the conductor core. A second conductor core fills the second opening and is connected to the first conductor core. The resulting integrated circuit has reduced capacitive coupling effects and is able to operate at higher speeds.

The present invention further provides a method for manufacturing an integrated circuit having a semiconductor substrate with a semiconductor device. A dielectric layer is formed on the semiconductor substrate and an opening is formed in the dielectric layer. A conductor core is deposited to fill the opening and an etch stop layer with a dielectric constant below 5.5 is formed over the first dielectric layer and conductor core. A second dielectric layer is deposited over the etch stop layer and a second opening is formed. A second conductor core is deposited to fill the second opening. The method allows the integrated circuit to have a denser etch stop layer and results in a reduced dielectric constant for the interlayer dielectric layers as a whole.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
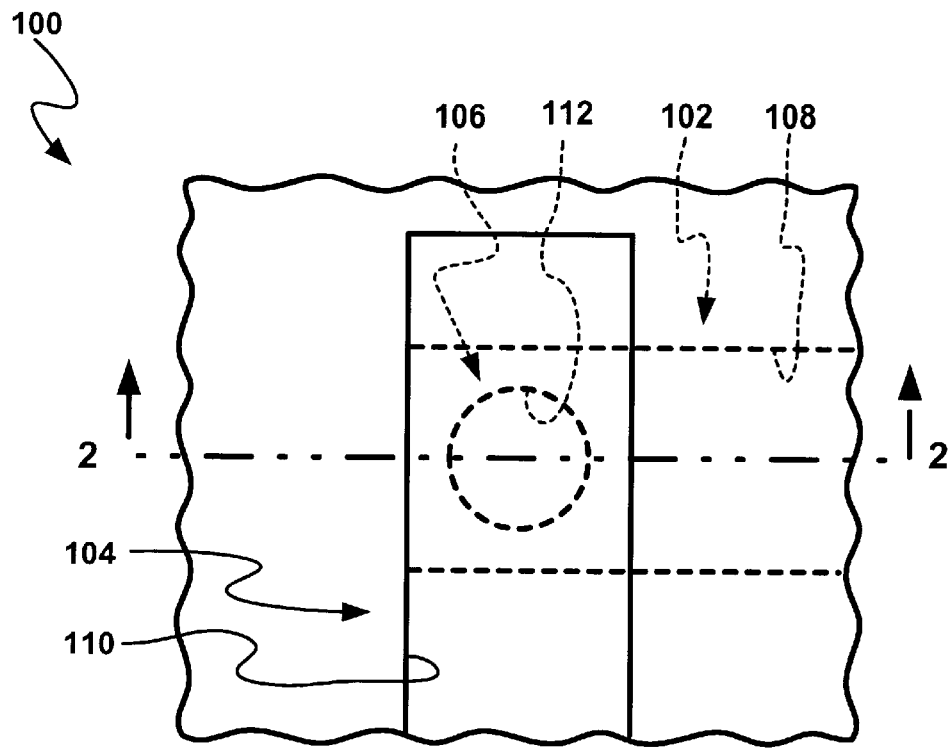
FIG. 1 (PRIOR ART) is a plan view of aligned channels with a connecting via.

Referring now to FIG. 1 (PRIOR ART), therein is shown a plan view of a semiconductor wafer 100 with a silicon semiconductor substrate (not shown) having as interconnects first and second channels 102 and 104 connected by a via 106. The first and second channels 102 and 104 are respectively disposed in first and second channel dielectric layers 108 and 110. The via 106 is an integral part of the second channel 104 and is disposed in a via dielectric layer 112.

The term "horizontal" as used in herein is defined as a plane parallel to the conventional plane or surface of a wafer, such as the semiconductor wafer 100, regardless of the orientation of the wafer. The term "vertical" refers to a direction perpendicular to the horizontal as just defined. Terms, such as "on", "above", "below", "side" (as in "sidewall"), "higher", "lower", "over", and "under", are defined with respect to the horizontal plane.

Figure 2:
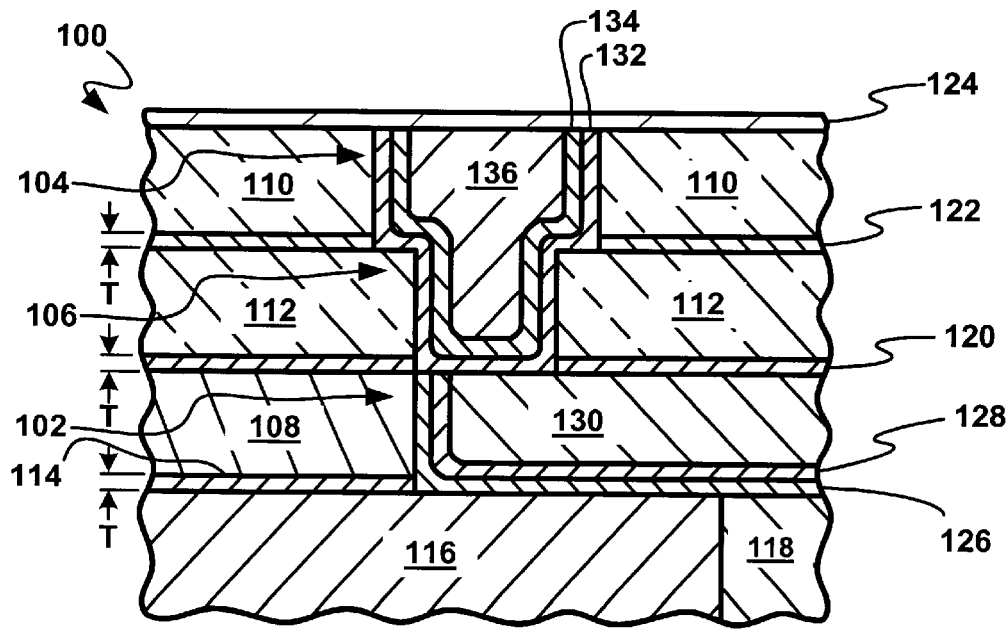
FIG. 2 (PRIOR ART) is a cross-section of FIG. 1 (PRIOR ART) along line 2—2.

Referring now to FIG. 2 (PRIOR ART), therein is shown a cross-section of FIG. 1 (PRIOR ART) along line 2—2. A portion of the first channel 102 is disposed in a first channel stop layer 114 and is on a device dielectric layer 116, which is on the silicon semiconductor substrate. Generally, metal contacts are formed in the device dielectric layer 116 to connect to an operative semiconductor device (not shown). This is represented by the contact of the first channel 102 with a semiconductor contact 118 embedded in the device dielectric layer 116. The various layers above the device dielectric layer 116 are sequentially: the first channel stop layer 114, the first channel dielectric layer 108, a via stop layer 120, the via dielectric layer 112, a second channel stop layer 122, the second channel dielectric layer 110, and a capping or next channel stop layer 124 (not shown in FIG. 1).

The first channel 102 includes a barrier layer 126, which could optionally be a combined adhesion and barrier layer, and a seed layer 128 around a conductor core 130. The second channel 104 and the via 106 include a barrier layer 132, which could also optionally be a combined adhesion and barrier layer, and a seed layer 134 around a conductor core 136. The barrier layers 126 and 132 are used to prevent diffusion of the conductor materials into the adjacent areas of the semiconductor device. The seed layers 128 and 134 form electrodes on which the conductor material of the conductor cores 130 and 136 are deposited. The seed layers 128 and 134 are of substantially the same conductor material as the conductor cores 130 and 136 and become part of the respective conductor cores 130 and 136 after the deposition.

In the past, for copper conductor material and seed layers, highly resistive diffusion barrier materials such as tantalum nitride (TaN), titanium nitride (TiN), or tungsten nitride (WN) are used as barrier materials to prevent diffusion.

The first channel stop layer 114, the via stop layer 120, and the second channel stop layer 122 are used as layers to stop the etching process which are used to etch and make the various channel and via openings in the respective first channel dielectric layer 108, the via dielectric layer 112, and the second channel dielectric layer 110. The stop layers are of a dielectric material deposited to a thickness "T" by a 500-watt plasma deposition process in an ammonia ($NH_3$) atmosphere at 4.8 torr pressure. Generally, the stop layer material is silicon nitride (SiN, $Si_xN_y$), which has a dielectric constant above 7.5 and which is deposited to a thickness "T" from 470 Å to 530 Å.

Figure 3:
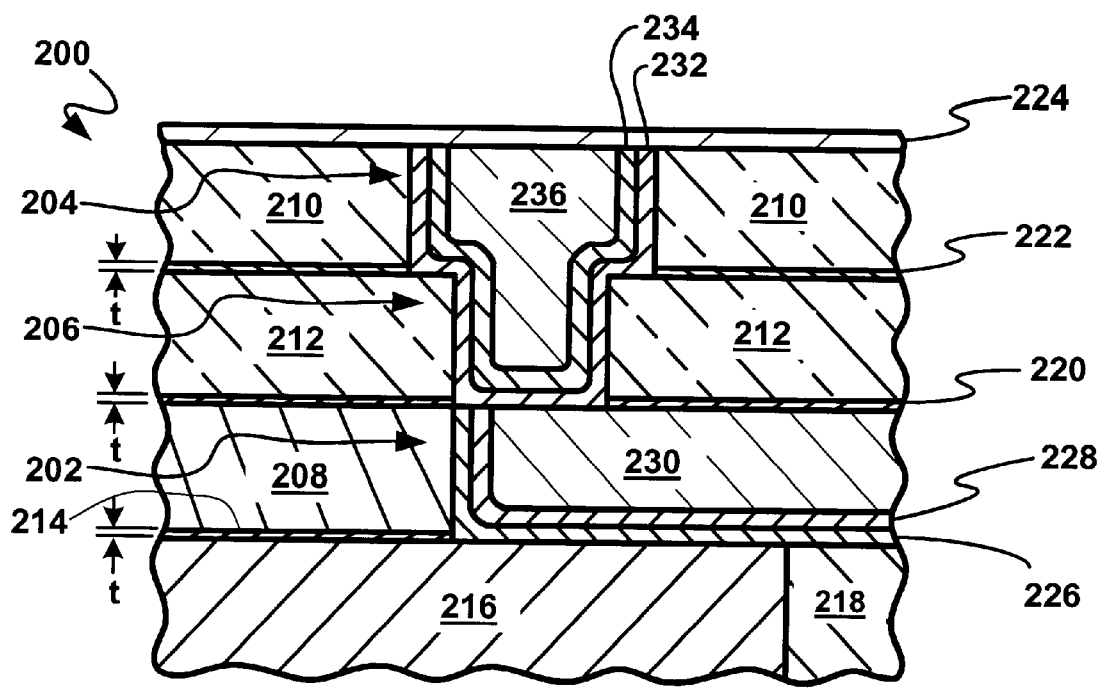
FIG. 3 is a cross-section, similar to FIG. 2 (PRIOR ART), showing the etch stop layer according to the present invention.

Referring now to FIG. 3, therein is shown a cross-section similar to that shown in FIG. 2 (PRIOR ART) of a semiconductor wafer 200 of the present invention. The semiconductor wafer 200 has first and second channels 202 and 204 connected by a via 206. The first and second channels 202 and 204 are respectively disposed in first and second dielectric layers 208 and 210. The via 206 is a part of the second channel 204 and is disposed in a via dielectric layer 212.

A portion of the first channel 202 is disposed in a first channel stop layer 214 and is on a device dielectric layer 216. Generally, metal contacts (not shown) are formed in the device dielectric layer 216 to connect to an operative semiconductor device (not shown). This is represented by the contact of the first channel 202 with a semiconductor device gate 218 embedded in the device dielectric layer 216. The various layers above the device dielectric layer 216 are sequentially: the first channel stop layer 214, the first channel dielectric layer 208, a via stop layer 220, the via dielectric layer 212, a second channel stop layer 222, the second channel dielectric layer 210, and a next channel stop layer 224.

The first channel 202 includes a barrier layer 226 and a seed layer 228 around a conductor core 230. The second channel 204 and the via 206 include a barrier layer 232 and a seed layer 234 around a conductor core 236. The barrier layers 226 and 232 are used to prevent diffusion of the conductor materials into the adjacent areas of the semiconductor device. The seed layers 228 and 234 form electrodes on which the conductor material of the conductor cores 230 and 236 is deposited. The seed layers 228 and 234 are of substantially the same conductor material of the conductor cores 230 and 236 and become part of the respective conductor cores 230 and 236 after the deposition.

The first channel stop layer 214, the via stop layer 220, and the second channel stop layer 222 are used as layers to stop the etching process which are used to etch and make the various channel and via openings in the respective first channel dielectric layer 208, the via dielectric layer 212, and the second channel dielectric layer 210.

In the present invention, a half thickness, high quality, etch stop layer (compared to the prior art etch stop layer) is deposited.

For example, for silicon nitride, the dielectric constant of an etch stop layer in accordance with the present invention is about 5.5 contrasted to an excess of 7.5 in the prior art.

It has been determined that a number of processes can be used to produce the under 5.5 dielectric constant etch stop layers which are in a thickness "t" as shown in FIG. 3, where the thickness "t" is from 270 Å to 330 Å thick.

First, multi-layer depositions may be used which eliminates pinholes and produces a denser film. For example, silicon nitride can be deposited in six 50 Å layers, either by successive deposition or by successive deposition and rotation between each deposition of a layer.

Second, for silicon nitride where silane ($SiH_4$) is used with ammonia ($NH_3$), the gas flow can be reduced and the pressure can be increased. For example, silicon nitride is formed in a plasma process using silane at a flow rate of 170 to 290 sccm and ammonia at a flow rate of 40 to 48 sccm and under a pressure of 4.0 to 4.8 torr Third, the silane flow may be reduced to about 50% of the prior art flow with increased pressure and nitrogen ($N_2$) can be used in place of the ammonia to reduce hydrogen ($H_2$). For example, silicon nitride is formed in a plasma process using silane at a flow rate of 170 to 290 sccm and nitrogen at a flow rate of 4700 to 6700 sccm and under a pressure of 4.0 to 4.8 torr.

Fourth, a 500 Å thick layer of silicon nitride can be deposited and then densified, for example, at a temperature of 450° C. to 480° C. for up to one hour.

With the reduced dielectric constant and the reduced thickness, the capacitive coupling effect between the first and second channels 202 and 204 is effectively reduced over 25% compared to the prior art.

In various embodiments, the barrier layers are of materials such as tantalum (Ta), titanium (Ti), tungsten (W), compounds thereof, and combinations thereof. The seed layers (where used) are of materials such as copper (Cu), gold (Au), silver (Ag), compounds thereof to and combinations thereof with one or more of the above elements. The conductor cores with or without seed layers are of materials such as copper, aluminum (Al), gold, silver, compounds thereof, and combinations thereof. The dielectric layers are of dielectric materials such as silicon oxide ($SiO_x$), tetraethoxysilane (TEOS), borophosphosilicate (BPSG) glass, etc. with dielectric constants from 4.2 to 3.9 or low dielectric constant dielectric materials such as fluorinated tetraethoxysilane (FTEOS), hydrogen silsesquioxane (HSQ), benzocyclobutene (BCB), etc. with dielectric constants below 3.9.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

The invention claimed is:

1. An integrated circuit comprising:
   a semiconductor substrate having a semiconductor device provided thereon;
   a first dielectric layer formed over the semiconductor substrate having a first opening provided therein;
   a first conductor core filling the first opening and connected to the semiconductor device;
   an etch stop layer of silicon nitride formed over the first dielectric layer and the first conductor core, the etch stop layer having a dielectric constant below 5.5;
   a second dielectric layer formed over the etch stop layer and having a second opening provided therein open to the first conductor core;

a second conductor core filling the second opening and connected to the first conductor core.

2. The integrated circuit as claimed in claim 1 wherein the etch stop layer is a multilayer structure.

3. The integrated circuit as claimed in claim 1 wherein the etch stop layer is a multilayer structure with each of the layers having a different layer orientation.

4. The integrated circuit as claimed in claim 1 wherein the first and second dielectric layers are of a material having a dielectric constant under 3.9.

5. The integrated circuit as claimed in claim 1 wherein the conductor core contains a material selected from a group consisting of copper, aluminum, gold, silver, a compound thereof, and a combination thereof.

6. An integrated circuit comprising:
   a semiconductor substrate having a semiconductor device provided thereon;
   a first dielectric layer formed over the semiconductor substrate having a first opening provided therein;
   a first conductor core filling the first opening and connected to the semiconductor device;
   a via etch stop layer of silicon nitride formed over the first dielectric layer and the first conductor core, the via etch stop layer having a dielectric constant below 5.5;
   a via dielectric layer formed over the via etch stop layer and having a via opening provided therein open to the first conductor core;
   a channel etch stop layer of silicon nitride formed over the via dielectric layer, the channel etch stop layer having a dielectric constant below 5.5;
   a second dielectric layer formed over the via dielectric layer and having a second opening provided therein open to the via opening; and
   a second conductor core filling the via and second openings and connected to the first conductor core.

7. The integrated circuit as claimed in claim 6 wherein the via and channel etch stop layers are a multilayer structure.

8. The integrated circuit as claimed in claim 6 wherein the via and channel etch stop layers are multilayer structures with each of the layers having a different layer orientation.

9. The integrated circuit as claimed in claim 6 wherein the first, via, and second dielectric layers are of a material having a dielectric constant under 3.9.

10. The integrated circuit as claimed in claim 6 wherein the first and second conductor cores contain materials selected from a group consisting of copper, gold, silver, a compound thereof, and a combination thereof.

\* \* \* \* \*